(12) United States Patent
Chen

(10) Patent No.: US 7,238,959 B2
(45) Date of Patent: Jul. 3, 2007

(54) PHASE CHANGE MEMORY DEVICE EMPLOYING THERMALLY INSULATING VOIDS AND SLOPED TRENCH, AND A METHOD OF MAKING SAME

(75) Inventor: Bomy Chen, Cupertino, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 292 days.

(21) Appl. No.: 10/979,411

(22) Filed: Nov. 1, 2004

(65) Prior Publication Data

US 2006/0092693 A1    May 4, 2006

(51) Int. Cl.
*H01L 29/02* (2006.01)
(52) U.S. Cl. .................. 257/2; 257/3; 257/4; 257/5; 257/276; 257/522
(58) Field of Classification Search ............ 257/2, 257/3, 4, 5, 276, 522
See application file for complete search history.

(56) References Cited

U.S. PATENT DOCUMENTS

| | | | |
|---|---|---|---|
| 5,536,947 A | 7/1996 | Klersy et al. | |
| 5,599,745 A | 2/1997 | Reinberg | |
| 5,847,439 A | 12/1998 | Reinberg | |
| 6,083,821 A | 7/2000 | Reinberg | |
| 6,087,674 A | 7/2000 | Ovshinsky et al. | |
| RE37,259 E | 7/2001 | Ovshinsky | |
| 6,355,551 B1 | 3/2002 | Reinberg | |
| 6,511,862 B2 | 1/2003 | Hudgens et al. | |
| 6,605,527 B2 | 8/2003 | Dennison et al. | |
| 2003/0209774 A1 | 11/2003 | Horii | |

OTHER PUBLICATIONS

U.S. Appl. No. 10/656,486, filed Sep. 2003, Chen.

*Primary Examiner*—Douglas M. Menz
(74) *Attorney, Agent, or Firm*—DLA Piper US LLP

(57) ABSTRACT

A phase change memory device, and method of making the same, that includes a trench formed in insulation material having opposing sidewalls that are inwardly sloping with trench depth. A first electrode is formed in the trench. Phase change memory material is formed in electrical contact with the first electrode. A second electrode is formed in electrical contact with the phase change memory material. Voids are formed in the insulation material to impede heat from the phase change memory material from conducting away therefrom. The voids are formed in pairs, with either a portion of the phase change memory material or the second electrode disposed between the voids.

13 Claims, 4 Drawing Sheets

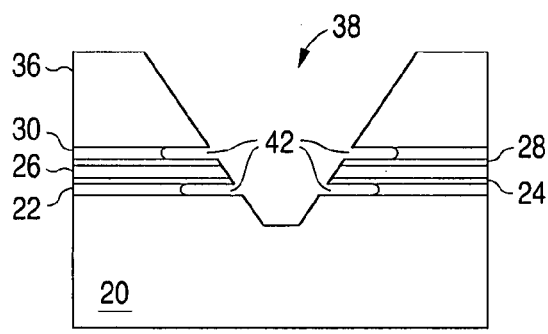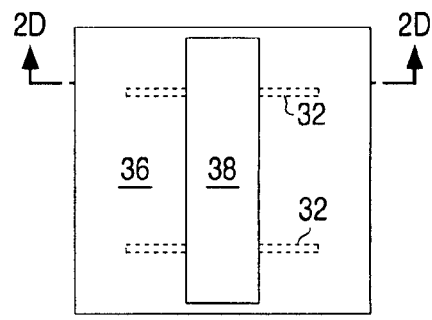
FIG. 2D  FIG. 3D
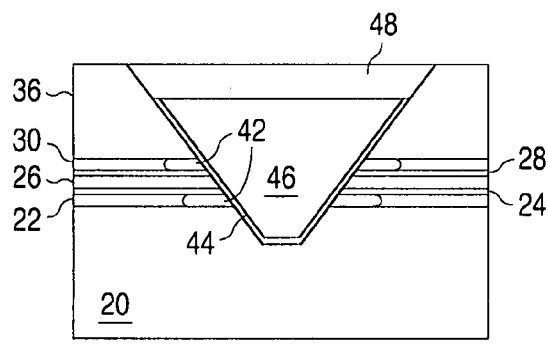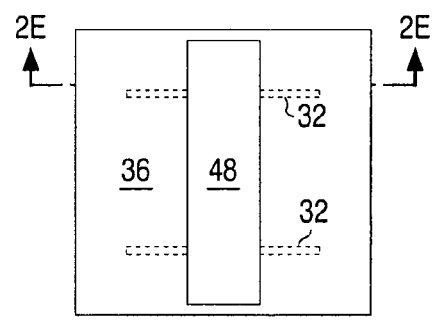
FIG. 2E  FIG. 3E
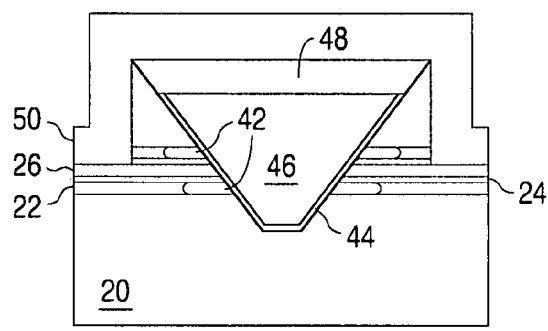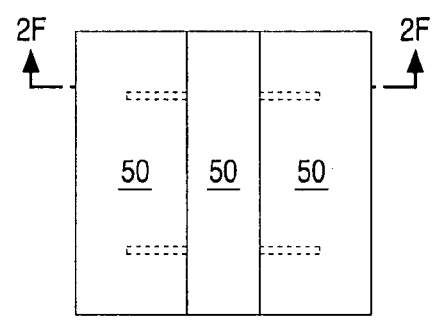
FIG. 2F  FIG. 3F

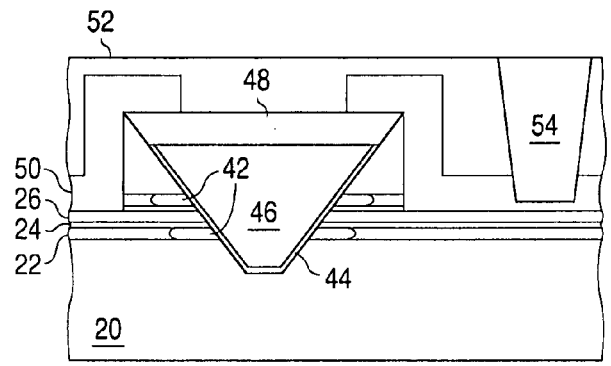
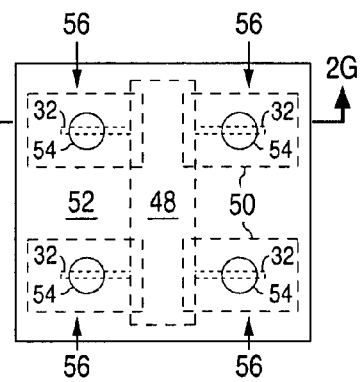
FIG. 2G  FIG. 3G
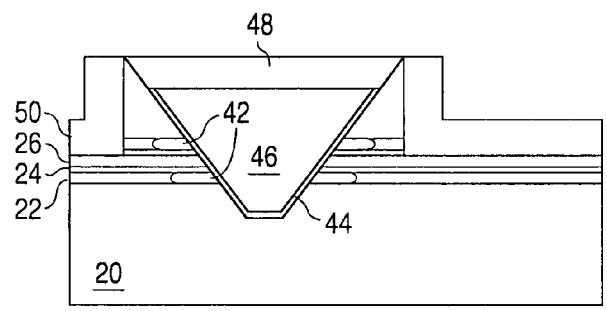
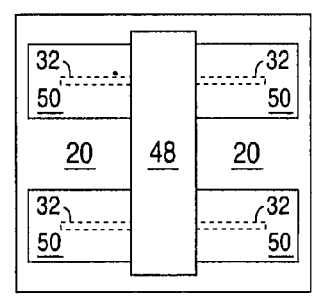
FIG. 5A  FIG. 6A
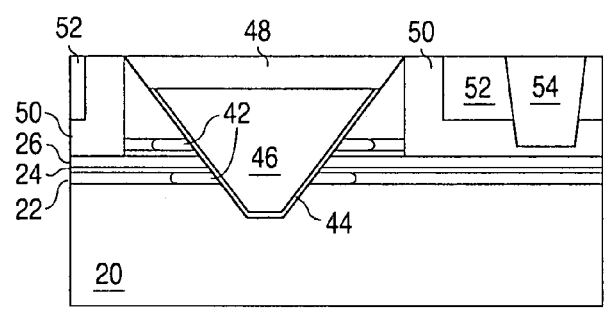
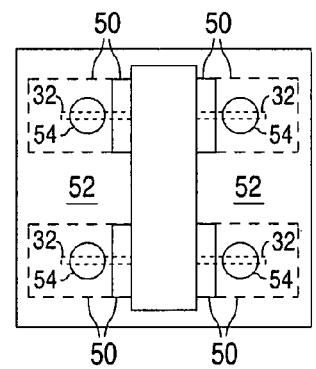
FIG. 5B  FIG. 6B

PHASE CHANGE MEMORY DEVICE EMPLOYING THERMALLY INSULATING VOIDS AND SLOPED TRENCH, AND A METHOD OF MAKING SAME

FIELD OF THE INVENTION

The present invention relates to phase change memory devices, and more particularly to phase change memory devices employing thermally insulating voids.

BACKGROUND OF THE INVENTION

There are many types of computer memory technologies that are presently used to store computer programs and data, including dynamic random access memory (DRAM), static random access memory (SRAM), erasable programmable read-only memory (EPROM), and electrically erasable programmable read only memory (EEPROM), etc. Some memory technologies require electrical power to maintain the stored data (i.e. volatile memory), while others do not (i.e. non-volatile memory). Memory technologies can be read only, write once only, or repeatedly read/write.

There is an increasing demand for repeatedly read/write, non-volatile memory. The primary non-volatile memory technology presently used is EEPROM, which utilizes floating gate field effect transistor devices each holding a charge on an insulated "floating gate". Each memory cell can be electrically programmed with a "1" or a "0" by injecting or removing electrons onto or from the floating gate. However, EEPROM memory cells are getting more difficult to scale down to smaller sizes, are relatively slow to read and program, and can consume a relatively large amount of power.

Phase change memory devices have also been known for some time. These devices use materials that can be electrically switched (programmed) between different structured states that exhibit different electrical read-out properties. For example, memory devices made of a chalcogenide material are known, where the chalcogenide material is programmed between a generally amorphous state that exhibits a relatively high resistivity, and a generally crystalline state that exhibits a relatively low resistivity. The chalcogenide material is programmed by heating the material, whereby the amplitude and duration of the heating dictates whether the chalcogenide is left in an amorphous or crystallized state. The high and low resistivities represent programmed "1" and "0" values, which can be sensed by then measuring the resistivity of the chalcogenide material.

FIG. 1A illustrates a conventional memory cell employing chalcogenide phase change memory material. The memory cell includes a layer of chalcogenide 2 disposed between a pair of electrodes 4/6, and over thermal insulator material 8. One of the electrodes (in this case the lower electrode 4) has an increased resistivity making it a thermal heater that heats the chalcogenide layer 2 when an electrical current is passed through the electrodes 4/6 (and through the chalcogenide layer 2). FIG. 1A, for example, shows the chalcogenide 2 in its crystallized form in which the material is highly conductive, and provides a low resistance between electrodes 4/6. When heated by electrode 4 by an amorphousizing thermal pulse, at least a portion 10 of the chalcogenide layer 2 is amorphousized, as shown in FIG. 1B, which increases the electrical resistance of the chalcogenide material. The chalcogenide 2 can by crystallized back to its lower electrical resistance state by applying a crystallization thermal pulse. The electrical resistance of this memory cell can be read using a small electrical current that does not generate enough heat to reprogram the chalcogenide material.

Phase change memory devices have a high program speed (e.g. 200 ns), and exhibit great endurance and program retention. It is even possible to program the phase change memory material with varying degrees of amorphousization and thus varying degrees of resistivity, for selecting from three or more values to store in a single memory cell (multi-bit storage).

There is a constant need to shrink down the size of the memory cells, including reducing the volume of programmed memory material. The power needed to program such memory cells is generally proportional to the cross-sectional area and volume of the memory material being amorphousized/crystallized. Thus, reducing the size and volume of the memory material used in each cell reduces the electrical current and power consumption of the memory device. Smaller sized memory cells also means smaller memory arrays, and more space between memory cells for thermal isolation.

Phase change memory devices are typically made by forming blocks of the memory material in holes etched into silicon materials. Thus, the resolution of the lithographic process used to make such holes dictates the dimensions of the memory material blocks in the memory cell. To shrink the cross-sectional area of the memory material blocks even further, it is known to form spacers inside the holes before the memory material blocks are formed. See for example U.S. Pat. No. 6,511,862, which teaches forming spacers over the heating electrode, and then filling the remaining space with a block of the memory material. While this technique reduces the width of the memory material block immediately adjacent the heating electrode, it also results in the formation of the memory material block over just part of the heating electrode, which inefficiently transfers heat to the block of memory material using only part of the electrode's upper surface. This technique also fails to reduce the overall width of the memory cell, as well as effectively reduce the depth of memory material being programmed.

Shrinking the size of phase change memory cell arrays can also produce undesirable "program disturb" affects, which results when heat generated by one phase change memory cell affects the programming of phase change memory material in an adjacent memory cell. The program temperature of chalcogenide material can be as high as approximately 350° C. Well known insulators used in most CMOS fabs (e.g. silicon oxide, silicon nitride, ILD, etc.) do not provide sufficient thermal isolation in some applications to prevent the programming of one memory cell from inadvertently affecting the resistance of phase change memory material in an adjacent memory cell.

There is a need for a method and memory cell design that increases the heating efficiency of the memory cell, increases the thermal isolation between memory cells, while reducing the size of the memory cells and the amount of memory material "programmed" by the heating process.

SUMMARY OF THE INVENTION

The present invention is a phase change memory device and method of making same that utilizes a thin layer of memory material and air insulation to minimize cell size and program disturb affects.

The phase change memory of the present invention includes a first electrode having a first sidewall, phase change memory material disposed in electrical contact with the first sidewall, a second electrode disposed in electrical contact with the phase change memory material wherein electrical current passing through the first and second electrodes and the phase change memory material generates heat for heating the phase change memory material; and insulation material disposed adjacent to the phase change memory material, wherein at least one void is formed in the insulation material to impede heat from the phase change memory material from conducting away therefrom.

In another aspect of the present invention, a phase change memory device includes a first electrode having a first sidewall, a layer of phase change memory material extending along the first sidewall, and a second electrode extending from the phase change memory material layer at a non-orthogonal angle relative to the phase change memory material layer, wherein electrical current passing through the first and second electrodes and the phase change memory material generates heat for heating the phase change memory material.

In yet another aspect of the present invention, a phase change memory device includes a trench formed in insulation material, wherein the trench includes opposing sidewalls, a first electrode disposed in the trench and having opposing sidewalls, a plurality of phase change memory material layers each disposed in electrical contact with one of the first electrodes, a plurality of second electrodes each disposed in electrical contact with one of the phase change memory material layers, wherein electrical current passing through the first and second electrodes and the phase change memory material layers generates heat for heating the phase change memory material layers, and a plurality of voids formed in the insulation material to impede heat from the phase change memory material layers from conducting away therefrom.

In yet one more aspect of the present invention, a phase change memory device includes a trench formed in insulation material, wherein the trench includes opposing sidewalls that are inwardly sloping with trench depth, a first electrode disposed in the trench and having opposing sidewalls, a plurality of phase change memory material layers each disposed in electrical contact with one of the first electrode, and a plurality of second electrodes each disposed in electrical contact with one of the phase change memory material layers, wherein electrical current passing through the first and second electrodes and the phase change memory material layers generates heat for heating the phase change memory material layers.

In one further aspect of the present invention, a method of making a phase change memory device includes forming a first insulation layer, forming a first layer of phase change memory material over the first insulation layer, forming a second insulation layer over the first layer of phase change memory material, forming a trench that extends into the first and second insulation layers and the first layer of phase change memory material, forming a first void in a portion of one of the first or second insulation layers, forming a first electrode in the trench that is disposed in electrical contact with the first layer of phase change memory material, and forming a second electrode in electrical contact with the layer of phase change memory material, wherein electrical current passing through the first and second electrodes and the phase change memory material generates heat for heating the phase change memory material, and wherein the first void impedes the heat from the phase change memory material from conducting away therefrom.

In yet one more aspect of the present invention, a method of making a phase change memory device includes forming a first insulation layer, forming a first electrode over the first insulation layer, forming a second insulation layer over the first electrode, forming a trench that extends into the first and second insulation layers and the first electrode, wherein the trench includes opposing sidewalls that are inwardly sloping with trench depth, forming a layer of phase change memory material along at least one of the opposing trench sidewalls, and forming a second electrode in the trench that is disposed in electrical contact with the phase change memory material layer, wherein electrical current passing through the first and second electrodes and the phase change memory material layer generates heat for heating the phase change memory material.

In another aspect of the present invention, a method of making a phase change memory device includes forming a trench in insulation material, wherein the trench includes opposing sidewalls, forming a first electrode in the trench, wherein the first electrode includes opposing sidewalls, forming a plurality of phase change memory material layers each disposed in electrical contact with one of the first electrodes, forming a plurality of second electrodes each disposed in electrical contact with one of the phase change memory material layers, wherein electrical current passing through the first and second electrodes and the phase change memory material layers generates heat for heating the phase change memory material layers, and forming a plurality of voids in the insulation material to impede heat from the phase change memory material layers from conducting away therefrom.

In one more aspect of the present invention, a method of forming a phase change memory device includes forming a trench in insulation material, wherein the trench includes opposing sidewalls that are inwardly sloping with trench depth, forming a first electrode in the trench, wherein the first electrode includes opposing sidewalls, forming a plurality of phase change memory material layers each disposed in electrical contact with one of the first electrodes, and forming a plurality of second electrodes each disposed in electrical contact with one of the phase change memory material layers, wherein electrical current passing through the first and second electrodes and the phase change memory material layers generates heat for heating the phase change memory material layers.

In yet one more aspect of the present invention, a method of forming phase change memory device includes forming a first electrode having a first sidewall, forming phase change memory material disposed in electrical contact with the first sidewall, forming a second electrode disposed in electrical contact with the phase change memory material, wherein electrical current passing through the first and second electrodes and the phase change memory material generates heat for heating the phase change memory material, forming insulation material disposed adjacent to the phase change memory material, and forming at least one void in the insulation material to impede heat from the phase change memory material from conducting away therefrom.

Other objects and features of the present invention will become apparent by a review of the specification, claims and appended figures.

BRIEF DESCRIPTION OF THE DRAWINGS

FIGS. 2A to 2G are cross-sectional views illustrating the process of forming the phase change memory device of the present invention.

FIGS. 3A to 3G are top views illustrating the process of forming the phase change memory device of the present invention.

FIGS. 5A to 5B are cross-sectional views illustrating an alternate process of forming the phase change memory device of the present invention.

FIGS. 6A to 6B are top views illustrating an alternate process of forming the phase change memory device of the present invention.

DETAILED DESCRIPTION OF THE PREFERRED EMBODIMENTS

The present invention is an improved phase change memory device, and method of making such a device, where thermal isolation between memory cells is improved, the volume of the phase change memory material programmed in the memory cell is reduced, and the heat used to program the memory device is efficiently focused onto that volume of material, which are achieved by sloping the sidewalls of the trench/hole in which the first electrode is formed and/or by utilizing voids (air gaps) to thermally insulate each memory cell.

Figure 2A:
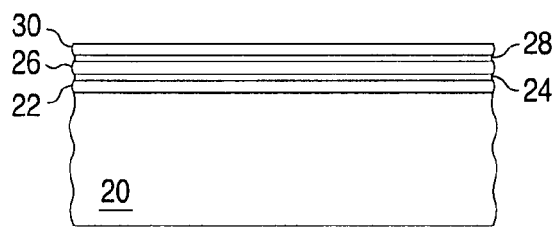
Figure 3A:
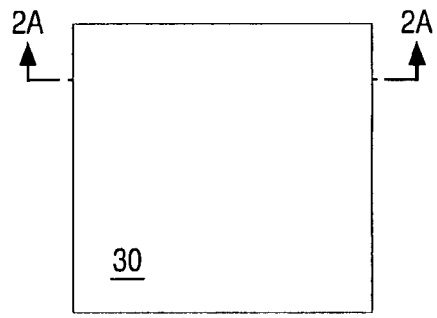

FIGS. 2A to 2G and 3A to 3G illustrate the formation of the phase change memory cells of the present invention. In FIG. 2A, a plurality of material layers 22, 24, 26, 28 and 30 are successively formed (e.g. deposited, grown, etc.) on or over insulation material 20 (e.g. ILD). Layers 22 and 30 are formed of insulation material, such as SiOx or SiCyOz formed by PEVED, with a thickness of around 20 to 100 nm. The material of layers 22 and 30 preferably has faster wet etch properties than does the insulation material 20. Layers 24 and 28 are formed of high quality protective material, such as UV-TEOS or ultra-slow PECVD $SiO_2$, with a thickness of around 2 to 10 nm. Layer 26 is formed of phase change memory material (e.g. 2 to 100 nm thick). The preferred phase change memory material is a chalcogenide alloy, which includes at least one Group VI element (e.g. $Ge_2Sb_2Te_5$). FIG. 3A is a top view of the structure shown in FIG. 2A.

Figure 2B:
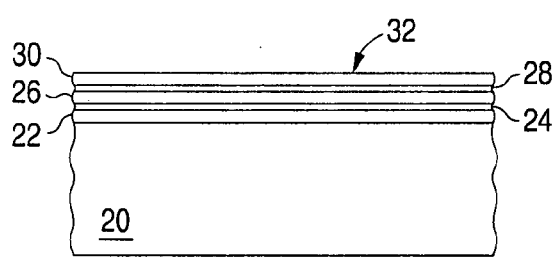
Figure 3B:
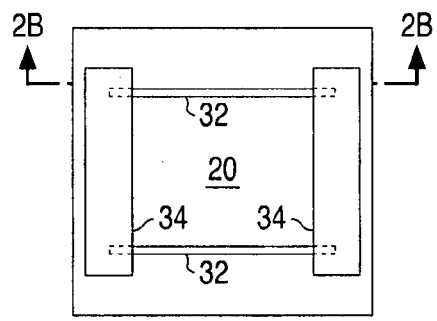

A conventional photo-lithographic etch process is performed to remove layers 22, 24, 26, 28 and 30 except for strip portions 32, as illustrated in FIG. 3B. The lithographic process includes forming etch block material only over narrow strips, and performing a series of etches to remove the exposed portions of layers 22, 24, 26, 28 and 30, leaving strip portions 32. In order to achieve extremely narrow strip portions 32, one possible lithographic technique can be to form photo resist material over the structure, and expose/etch thin trenches into the photo resist material. Spacers can then be formed in the trenches to narrow them. Formation of spacers is well known in the art, and involves the deposition of a material over the contour of a structure, followed by an anisotropic etch process, whereby the material is removed from horizontal surfaces of the structure, while the material remains largely intact on vertically oriented surfaces of the structure. The narrowed trenches are then filled with an etch block material, after which the photo resist is removed, leaving just the very narrow strips of etch block material. These very narrow strips of etch block material can be used as the etch blocks for producing the very narrow strip portions 32 of layers 22, 24, 26, 28 and 30, as shown in FIGS. 2B and 3B. An optional mask material 34 can be formed over the ends of strip portions 32 for isolation, as shown in FIG. 3B.

Figure 2C:
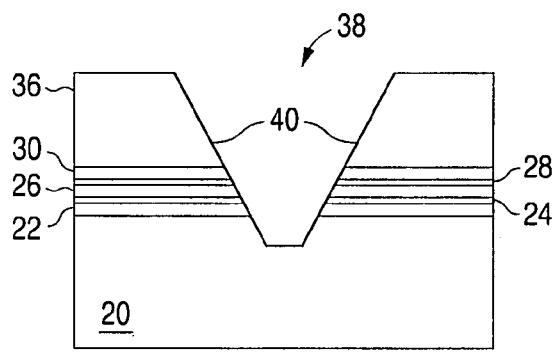
Figure 3C:
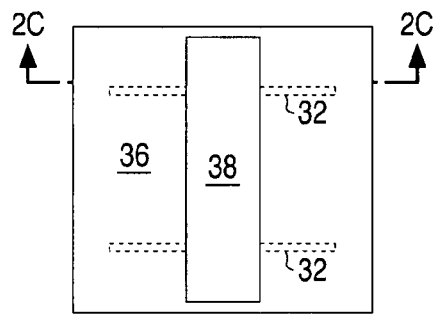

Insulation material 36 (e.g. ILD) is then formed over the structure, followed by another photo-lithographic etch process to form a trench that extends through layers 36, 30, 28, 26, 24, 22 and into insulation 20, as shown in FIGS. 2C and 3C. The etch process is performed such that the opposing sidewalls 40 of the trench 38 are inwardly sloping with trench depth (i.e. trench width narrows and sidewalls 40 get closer together with trench depth), with the sidewalls 40 extending at an angle (e.g. 30 to 60 degrees) from vertical. This is performed by forming photo resist over the structure except for where the trenches are to be formed, followed by a dry etch (e.g. RIE) with a relatively soft mask material that is laterally etched as the trench is formed (e.g. etch rate of less than about 2 to 1, versus an etch rate of traditional mask materials that is typically greater than 5 to 1), such that trench 38 is formed with sloped sidewalls 40.

A wet etch is then used to form voids (i.e. air gaps) 42 extending from the trench sidewalls 40 laterally into layers 22 and 30, as shown in FIG. 2D. Depending on the material used, this etch will also remove some of the exposed portions of layers 36, 28, 26, 24 and/or 20, widening somewhat the width of trenches 38. This is why the material used to form layers 22 and 30 preferably has faster etch properties than the other layers, so that voids 42 of sufficient dimensions can be formed without removing excessive amounts of adjacent materials.

The trench 38 is then filled with a conductive material that forms a first electrode for the memory devices. Preferably the first electrode is formed by forming a conductive liner material 44 (e.g. TiW) along the trench sidewalls 40, followed by forming a thick layer of conductive material over the structure (e.g. W) and an etch back process to recess the conductive material from the top of trench 38, leaving a block 46 of the conductive material in trench 38. The first electrode 44/46 seal voids 42. A hard damascene mask material 48 such as nitride is then deposited over the structure, followed by etch process using the insulation material 36 as an etch stop, to seal the top of trench 38, as shown in FIG. 2E.

An anisotropic etch process is then used to remove exposed portions of insulation layers 36, 30 and 28 (i.e. those portions not protected by mask material 48), to expose memory material layer 26. A layer 50 of the memory material is then formed over the structure, as illustrated in FIG. 2F, which makes electrical contact with memory material 26.

A photo-lithographic etch process is then used to remove portions of memory material layer 50 over mask layer 48 and between strip portions 32 (to isolate adjacent memory cells from each other). Insulation material 52 is then formed over the structure. Trenches or holes are formed into the insulation material 52 using a lithographic etch that extend down to and expose memory material 50 for each memory cell (can use memory material 50 as an etch stop). These trenches or holes are then filed with conductive material such as TiW or W using a deposition and etch back process, to form second electrodes 54. Preferably, the second electrodes 54 have a dimension thickness (e.g. 50 to 500 nm) at the point of contact with memory material 50 that is significantly larger than the thickness of memory material layer 26 at the point it meets first electrode 46. The resulting memory cell configuration is shown in FIGS. 2G and 3G, where pairs of memory cells 56 are formed along opposing sides of first electrode 44/46.

To program the memory cell 56, a voltage is applied across first and second electrodes 44/46 and 54 so that an electrical current pulse of predetermined amplitude and duration flows through memory material layers 26/50. Because memory material layer 26 adjacent first electrode 44/46 constitutes the smallest cross sectional area of the current path through the memory material 26/50, the electrical current pulse generates heat that is concentrated at that portion of memory material 26 adjacent first electrode 44/46 where there is the greatest current density. The generated heat in turn heats the memory material 26 which is amorphousized or crystallized depending on the amplitude and duration of the electrical current pulse, as discussed below.

Figure 1A:
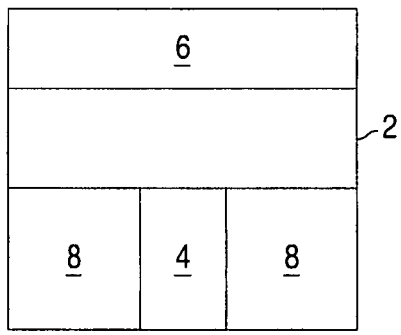
FIG. 1A is a cross-sectional view of a conventional phase change memory device.
Figure 1B:
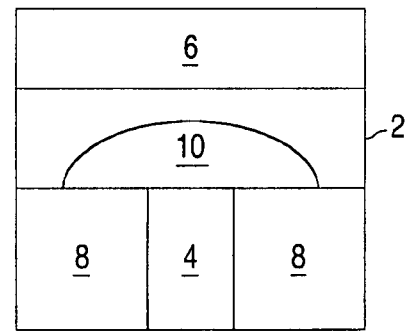
FIG. 1B is a cross-sectional view of the conventional phase change memory device, after undergoing an amorphousizing thermal pulse.
Figure 4:
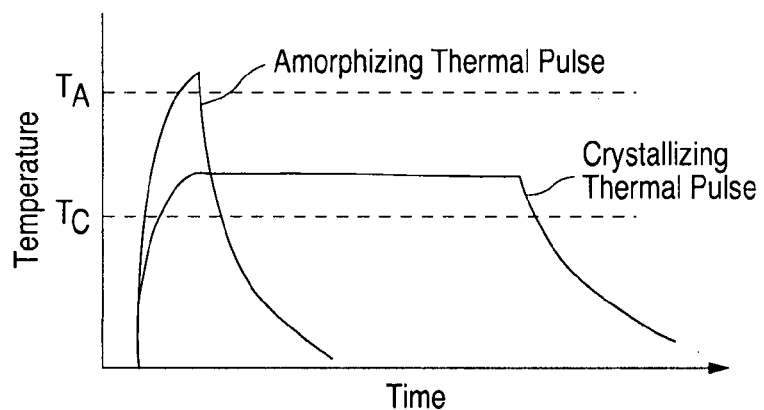
FIG. 4 is a graph illustrating amorphousizing and crystallization of the phase change memory material of the present invention.

FIG. 4 is a graphical representation of how the layer 26 of chalcogenide phase change memory material (and in particular that portion thereof adjacent first electrode 44/46) is programmed with either a relatively high or relatively low resistivity. To amorphousize the chalcogenide memory material, it is heated to a temperature beyond its amorphousizing temperature $T_A$. Once this temperature is reached, the volume of memory material is rapidly cooled by removing the electrical current flow. So long as the memory material is cooled faster than the rate at which it can crystallize, the memory material is left in a relatively high resistive amorphous state. To crystallize the memory material, it is heated beyond its crystallization temperature $T_C$, and maintained above that temperature for a sufficient time to allow the memory material to crystallize. After such time, the electrical current flow is removed, and the memory material is left in a relatively low resistive crystallized state. It is also possible to vary the thermal pulse amplitude and duration to produce varying degrees of resistivity for multi-bit storage in a single memory cell.

To read the memory cell 56, an electrical current is passed through the memory cell that has an amplitude and/or duration that is insufficient to program the memory material, but is sufficient to measure its resistivity. Low or high resistivities (corresponding to crystallized or amorphous states respectively of the memory material 26) represent digital "1" or "0" values (or a range of resistivities representing multiple bits of data). These values are maintained by the memory cells 56 until they are reprogrammed. The memory cells 56 are preferably formed in an array configuration, with a column of memory cells sharing a single first electrode 46 but each having its own second electrode 56, so that each memory cell 56 can be individually programmed and read without disturbing adjacent memory cells.

The present invention has many advantages. In particular, voids 42 are disposed above and below that portion of memory material layer 26 that is being programmed, to help prevent the heat generated during programming of one memory cell from conducting through the surrounding insulation material and adversely affecting adjacent memory cells. Voids 42 also provide some mechanical freedom for the portion of the phase change memory material layers being programmed, which further reduces the energy needed for programming while ensuring accurate control over electrical resistance. Both the voids 42 and the programmable portion of memory material layer 26 are self aligned to the sloped sidewall of first electrode 44/46. The amount of programmed memory material is limited by the width and thickness of strip portions 32 and layer 26, thus reducing the power consumption and increasing programming speed. Memory material layer 50 provides a large target (both horizontally and in thickness) for forming second electrodes 54, so that precise accuracy on electrode location need not be necessary.

FIGS. 5A to 5B and 6A to 6B illustrate an alternate method of forming the memory cells of the present invention. This alternate method starts with the structure shown in FIGS. 2F and 3F. An anisotropic etch process is performed to etch down memory material layer 50, using mask layer 48 as an etch stop, as shown in FIGS. 5A and 6A. Insulation material 52 is then formed over the structure, followed by an etch back process that also uses mask layer 52 as an etch stop. Second electrodes 54 then formed as described above, resulting in the structure shown in FIGS. 5B and 6B.

Figure 7:
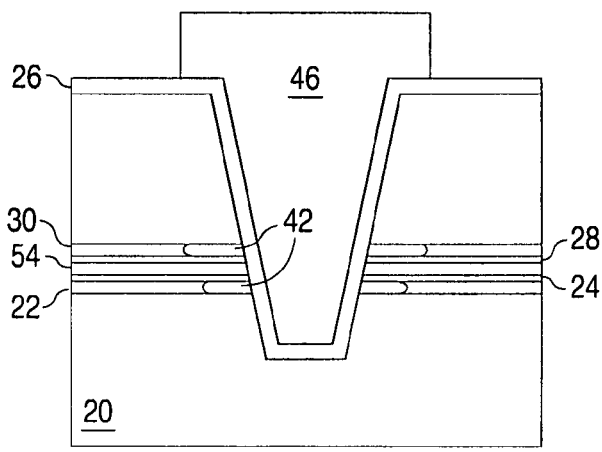
FIG. 7 is a cross-sectional view illustrating a second alternate embodiment of the phase change memory device of the present invention.

FIG. 7 illustrates a second alternate embodiment of the present invention, where second electrode 54 is formed as a thin layer of conductive material between insulation layers 24/28, and the memory material 26 is formed as a thin layer extending along the sidewalls 40 of trenches/holes 38. PVD sputtering of the memory material along sidewalls 40 provides for an even layer of the memory material of controlled thickness (e.g. 2–9 nm using Ulvac high precision slow rate deposition).

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed therebetween). For example, forming an element "over a substrate" can include forming the element directly on the substrate with no intermediate materials/elements therebetween, as well as forming the element indirectly on the substrate with one or more intermediate materials/elements therebetween.

It is to be understood that the present invention is not limited to the embodiment(s) described above and illustrated herein, but encompasses any and all variations falling within the scope of the appended claims. For example, while first and second electrodes 44/46 and 54 are shown as circular, any appropriate shape can be used. Materials, processes and numerical examples described above are exemplary only, and should not be deemed to limit the claims. As is apparent from the claims and specification, not all method steps need be performed in the exact order illustrated or claimed, but rather in any order that allows the proper formation of the memory cell of the present invention. Insulation material 20 can be formed directly or indirectly over a substrate, or the insulation material 20 can be the substrate itself. The second electrode could be formed below memory material layer 26 instead of above. The voids could be formed just below or just above the memory material layer 26 or second electrode layer 54, instead of both above and below as shown. Single layers of material can be formed as multiple layers of such or similar materials, and vice versa. For example, the number of insulation layers can be increased or decreased from that shown. Lastly, the sloped sidewalls of first electrode or trench/hole 38 can be used without the use of voids 42, and vice versa.

What is claimed is:

1. A phase change memory device, comprising:
   a first electrode having a first sidewall;
   phase change memory material disposed in electrical contact with the first sidewall;

a second electrode disposed in electrical contact with the phase change memory material, wherein electrical current passing through the first and second electrodes and the phase change memory material generates heat for heating the phase change memory material; and insulation material disposed adjacent to the phase change memory material, wherein at least one void is formed in the insulation material to impede heat from the phase change memory material from conducting away therefrom.

2. The phase change memory device of claim 1, wherein the at least one void is a pair of voids, and wherein a portion of the phase change memory material is disposed between the pair of voids.

3. The phase change memory device of claim 2, wherein the pair of voids are directly adjacent the first sidewall.

4. The phase change memory device of claim 2, wherein the phase change memory material includes a first layer of the phase change memory material that extends from the first sidewall and a portion of the first layer is disposed between the pair of voids.

5. The phase change memory device of claim 4, wherein the first layer extends at a non-orthogonal angle relative to the first sidewall.

6. The phase change memory device of claim 4, wherein the phase change memory material further includes a second layer of the phase change memory material that is disposed in electrical contact with the first layer and the second electrode and does not extend between the pair of voids.

7. The phase change memory device of claim 6, wherein the first and second layers form a current path between the first and second electrodes, and wherein the current path has a minimum cross sectional area directly adjacent the first electrode.

8. The phase change memory device of claim 6, wherein the first and second layers form a current path between the first and second electrodes, and wherein the current path has a minimum cross sectional area between the pair of voids.

9. The phase change memory device of claim 6, wherein the second layer has a greater thickness than that of the first layer.

10. The phase change memory device of claim 9, wherein the second layer extends up and over the first electrode.

11. The phase change memory device of claim 1, wherein the phase change memory material includes a layer of the phase change memory material that extends along the first sidewall, and wherein the second electrode extends from the phase change memory material layer.

12. The phase change memory device of claim 11, wherein the at least one void is a pair of voids, and wherein a portion of the second electrode is disposed between the pair of voids.

13. The phase change memory device of claim 11, wherein the second electrode extends at a non-orthogonal angle relative to the phase change memory material layer.

* * * * *